United States Patent
Po

(10) Patent No.: US 9,786,340 B2
(45) Date of Patent: Oct. 10, 2017

(54) DRIVING CIRCUIT FOR NON-VOLATILE MEMORY

(71) Applicant: eMemory Technology Inc., Hsin-Chu (TW)

(72) Inventor: Chen-Hao Po, Hsinchu (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 0 days.

(21) Appl. No.: 15/347,158

(22) Filed: Nov. 9, 2016

(65) Prior Publication Data

US 2017/0206941 A1    Jul. 20, 2017

Related U.S. Application Data

(60) Provisional application No. 62/280,683, filed on Jan. 19, 2016.

(51) Int. Cl.
| | |
|---|---|
| *G11C 7/10* | (2006.01) |
| *G11C 7/12* | (2006.01) |
| *G11C 7/22* | (2006.01) |

(52) U.S. Cl.
CPC .............. *G11C 7/12* (2013.01); *G11C 7/10* (2013.01); *G11C 7/22* (2013.01)

(58) Field of Classification Search
CPC ....... G11C 16/08; G11C 11/4085; G11C 8/08; G11C 11/405; G11C 11/22; G11C 11/417; G11C 16/10; G11C 16/12; G11C 16/28; G11C 16/30; G11C 2207/2227; G11C 7/1006; G11C 7/1078; G11C 7/1096; G11C 7/22

USPC ............ 365/185.23, 189.11, 230.06, 185.29, 365/189.09, 145, 149, 154, 185.26, 365/185.28, 185.33, 189.05, 189.16, 191, 365/218, 226, 227, 228

See application file for complete search history.

(56) References Cited

U.S. PATENT DOCUMENTS

| | | |
|---|---|---|
| 7,145,370 B2 | 12/2006 | Bernard et al. |
| 7,580,311 B2 | 8/2009 | Pesavento |
| 8,610,490 B2 | 12/2013 | Marotta et al. |
| 8,963,609 B2 | 2/2015 | Yeung et al. |
| 2001/0021128 A1* | 9/2001 | Kim ..................... G11C 16/08 365/185.23 |

(Continued)

OTHER PUBLICATIONS

European Patent Office, "Search report", issued on Jun. 22, 2017.

*Primary Examiner* — Thong Q Le
(74) *Attorney, Agent, or Firm* — WPAT, PC

(57) ABSTRACT

A driving circuit includes a driving stage with a first level shifter and a second level shifter. The first level shifter includes an input terminal receiving a first control signal, an inverted input terminal receiving an inverted first control signal, a first output terminal, and a second output terminal. The second level shifter includes an input terminal receiving a second control signal, an inverted input terminal receiving an inverted second control signal, a third output terminal, and a fourth output terminal. The first output terminal and the third output terminal are connected with each other to generate an output signal. The second output terminal and the fourth output terminal are connected with each other to generate an inverted output signal. Moreover, one of the first level shifter and the second level shifter is enabled according to an operation mode of the driving circuit.

20 Claims, 9 Drawing Sheets

(56) References Cited

U.S. PATENT DOCUMENTS

2005/0134355 A1 6/2005 Maede et al.
2009/0243692 A1 10/2009 Chang
2010/0301818 A1 12/2010 Kim
2015/0194961 A1 7/2015 Luthra
2016/0094208 A1 3/2016 Teplechuk

* cited by examiner

| | Vdd | Vpp | Vnn | EN1 | EN2 | EN3 | EN3I | EN4 | Ctl1A, Ctl1B | Ctl2A, Ctl2B | OUT, ZOUT |
|---|---|---|---|---|---|---|---|---|---|---|---|
| First operation mode I | <Vthn+\|Vthp\| | Vdd | 0V | 0V | Vdd | Vdd | 0V | 0V | 'Hi'=Vdd 'Lo'=0V | 'Hi'=Vdd 'Lo'=0V | 'Hi'=Vdd 'Lo'=0V |
| II | | Vdd | 0V | 0 | 0 | 0 | Vdd | 0 | 'Hi'=Vdd 'Lo'=0V | 'Hi'=Vdd 'Lo'=0V | Vdd, Vdd |
| Second operation mode II | ≥Vthn+\|Vthp\| | Vdd | 0V | 0 | 0 | Vdd | 0 | 0 | 'Hi'=Vdd 'Lo'=0V | 'Hi'=Vdd 'Lo'=0V | 'Hi'=Vdd 'Lo'=0V |
| III | | V1= N x Vdd | 0V | V1 | V2= M x Vdd | V1 | V2 | V2 | 'Hi'=Vdd 'Lo'=0V | 'Hi'=Vdd 'Lo'=0V | 'Hi'=V1 'Lo'=V2 |

FIG. 2B

| | Vdd | Vpp | Vnn | EN1 | EN2 | EN3 | EN3I | EN4 | Ctl1A, Ctl1B | Ctl2A, Ctl2B | OUT, ZOUT |
|---|---|---|---|---|---|---|---|---|---|---|---|
| First operation mode | <Vthn+\|Vthp\| | Vdd | 0V | - | Vdd | Vdd | 0V | 0V | 'Hi'=Vdd 'Lo'=0V | 'Hi'=Vdd 'Lo'=0V | 'Hi'=Vdd 'Lo'=0V |
| Second operation mode I | ≥Vthn+\|Vthp\| | Vdd | 0V | - | 0 | 0 | Vdd | 0 | 0V, 0V | 'Hi'=Vdd 'Lo'=0V | Vdd, Vdd |
| Second operation mode II | | Vdd | 0V | - | 0 | Vdd | 0 | 0 | 0V, 0V | 'Hi'=Vdd 'Lo'=0V | 'Hi'=Vdd 'Lo'=0V |
| Second operation mode III | | V1= N × Vdd | 0V | - | V2= M × Vdd | V1 | V2 | V2 | 0V, 0V | 'Hi'=Vdd 'Lo'=0V | 'Hi'=V1 'Lo'=V2 |

FIG. 3B

| | Vdd | Vpp | Vnn | EN1 | EN2 | EN3 | EN3I | EN4 | Ctl1A, Ctl1B | Ctl2A, Ctl2B | OUT, ZOUT |
|---|---|---|---|---|---|---|---|---|---|---|---|
| First operation mode | <Vthn+\|Vthp\| | Vdd | 0V | 0V | Vdd | Vdd | 0V | 0V | 'Hi'=Vdd 'Lo'=0V | 'Hi'=Vdd 'Lo'=0V | 'Hi'=Vdd 'Lo'=0V |
| Second operation mode I | ≥Vthn+\|Vthp\| | Vdd | 0V | 0 | 0 | 0 | Vdd | 0 | 'Hi'=Vdd 'Lo'=0V | 'Hi'=Vdd 'Lo'=0V | Vdd, Vdd |
| Second operation mode II | | Vdd | 0V | 0 | 0 | Vdd | Vdd | 0 | 'Hi'=Vdd 'Lo'=0V | 'Hi'=Vdd 'Lo'=0V | 'Hi'=Vdd 'Lo'=0V |
| Second operation mode III | | V1= N×Vdd | 0V | V1 | V2= M×Vdd | V1 | V2 | V2 | 'Hi'=Vdd 'Lo'=0V | 'Hi'=Vdd 'Lo'=0V | 'Hi'=V1 'Lo'=V2 |

DRIVING CIRCUIT FOR NON-VOLATILE MEMORY

This application claims the benefit of U.S. provisional application Ser. No. 62/280,683, filed Jan. 19, 2016, the disclosure of which is incorporated by reference herein in its entirety.

FIELD OF THE INVENTION

The present invention relates to a driving circuit, and more particularly to a driving circuit for a non-volatile memory.

BACKGROUND OF THE INVENTION

As is well known, a non-volatile memory is able to continuously retain data after the supplied power is interrupted. Consequently, the non-volatile memory is widely used in a variety of electronic products. Generally, the non-volatile memory comprises a memory array. The memory array consists of plural non-volatile memory cells. In addition, each non-volatile memory cell has a floating gate transistor.

The non-volatile memory further comprises a voltage supplying circuit and a driving circuit. For achieving the purpose of ultra-low power consumption, the voltage supplying circuit has to provide a suitable system voltage to the driving circuit according to the operation mode of the non-volatile memory. Consequently, the driving circuit provides suitable logic levels to the memory array of the non-volatile memory.

For example, according to the operation mode of the memory array of the non-volatile memory, the driving circuit provides suitable logic levels to control a read operation or a program operation of the memory array of the non-volatile memory.

SUMMARY OF THE INVENTION

The present invention provides a driving circuit for providing a suitable operating voltage to a memory array of a non-volatile memory according to an operating mode of the non-volatile memory.

An embodiment of the present invention provides a driving circuit. The driving circuit is connected to a memory array of a non-volatile memory. The driving circuit includes a driving stage. The driving stage includes a first level shifter and a second level shifter. The first level shifter includes a first input terminal, a first inverted input terminal, a first output terminal and a second output terminal. The first input terminal receives a first control signal. The first inverted input terminal receives an inverted first control signal. The second level shifter includes a second input terminal, a second inverted input terminal, a third output terminal and a fourth output terminal. The second input terminal receives a second control signal. The second inverted input terminal receives an inverted second control signal. The first output terminal and the third output terminal are directly connected with each other to generate an output signal. The second output terminal and the fourth output terminal are directly connected with each other to generate an inverted output signal. The first level shifter is enabled according to an enabling signal set when the driving circuit is in a first operation mode. The second level shifter is enabled according to the enabling signal set when the driving circuit is in a second operation mode.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 2B is a table illustrating the magnitudes of the supply voltages and the voltage levels of associated signals when the driving circuit with the driving stage of FIG. 2A is operated in different operation modes;

FIG. 3B is a table illustrating the magnitudes of the supply voltages and the voltage levels of associated signals when the driving circuit with the driving stage of FIG. 3A is operated in different operation modes;

FIG. 4B is a table illustrating the magnitudes of the supply voltages and the voltage levels of associated signals when the driving circuit with the driving stage of FIG. 4A is operated in different operation modes;

DETAILED DESCRIPTION OF PREFERRED EMBODIMENTS

Figure 1:
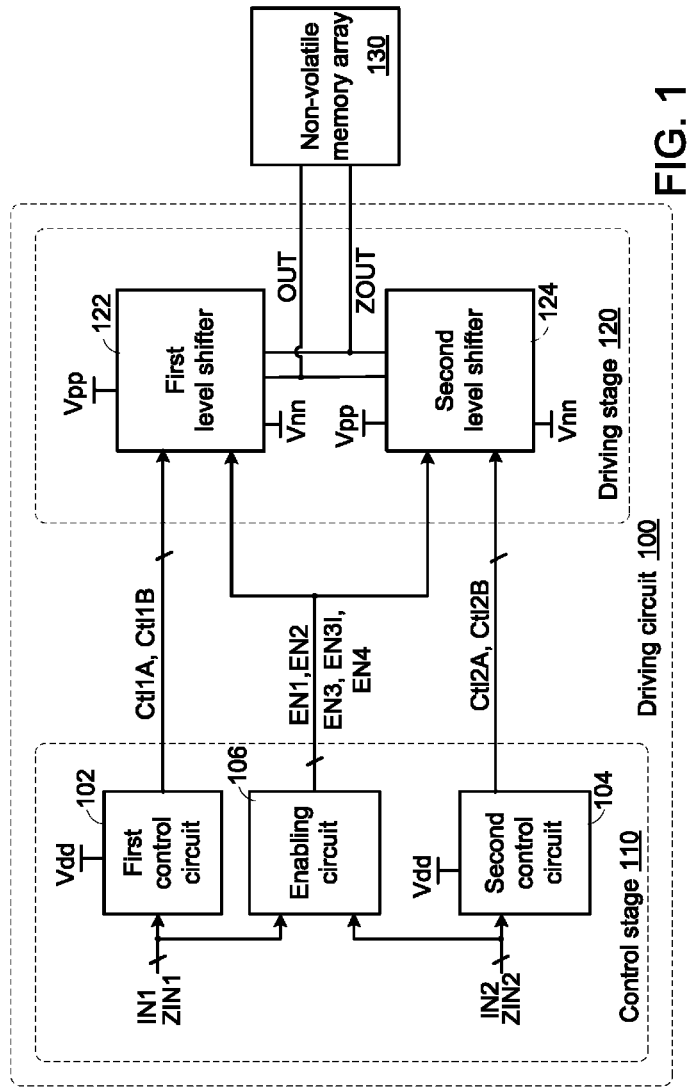
FIG. 1 is a schematic circuit diagram illustrating a driving circuit for a non-volatile memory according to an embodiment of the present invention.

FIG. 1 is a schematic circuit diagram illustrating a driving circuit for a non-volatile memory according to an embodiment of the present invention. As shown in FIG. 1, a memory array 130 of the non-volatile memory (also referred as a non-volatile memory array) is connected with the driving circuit 100. Moreover, the non-volatile memory array 130 receives an output signal OUT and an inverted output signal ZOUT from the driving circuit 100.

The driving circuit 100 comprises a control stage 110 and a driving stage 120. The control stage 110 comprises a first control circuit 102, a second control circuit 104 and an enabling circuit 106. The driving stage 120 comprises a first level shifter 122 and a second level shifter 124.

The non-volatile memory further comprises a voltage supplying circuit (not shown) for providing plural supply voltages to the driving circuit 100. In an embodiment, the voltage supplying circuit provides a first supply voltage Vdd, a second supply voltage Vpp a third supply voltage Vnn, and a fourth supply voltage Vm to the driving circuit 100.

The first control circuit 102 is connected with the first supply voltage Vdd. Moreover, the first control circuit 102 receives a first input signal IN1 and an inverted first input signal ZIN1, and converts the two signals IN1 and ZIN1 into a first control signal Ctl1A and an inverted first control signal Ctl1B. The second control circuit 104 is connected with the first supply voltage Vdd. Moreover, the second control circuit 104 receives a second input signal IN2 and an inverted second input signal ZIN2, and converts the two signals IN2 and ZIN2 into a second control signal Ctl2A and an inverted second control signal Ctl2B. The voltage levels of the first control signal Ctl1A, the inverted first control signal Ctl1B, the second control signal Ctl2A and the inverted second control signal Ctl2B are all in the range between the first supply voltage Vdd and a ground voltage Gnd (0V).

The enabling circuit 106 receives the first input signal IN1, the inverted first input signal ZIN1, the second input signal IN2 and the inverted second input signal ZIN2, and generates an enabling signal set. The enabling signal set includes a first enabling signal EN1, a second enabling signal EN2, a third enabling signal EN3, an inverted third enabling signal EN3I and a fourth enabling signal EN4. The enabling circuit 106 are connected with the first supply voltage Vdd, the second supply voltage Vpp, the third supply voltage Vnn, and the fourth supply voltage Vm.

The first level shifter 122 of the driving stage 120 has a first output terminal and a second output terminal. The second level shifter 124 has a first output terminal and a second output terminal. The first output terminal of the first level shifter 122 and the first output terminal of the second level shifter 124 are directly connected with each other to generate the output signal OUT. The second output terminal of the first level shifter 122 and the second output terminal of the second level shifter 124 are directly connected with each other to generate the inverted output signal ZOUT. Moreover, the driving stage 120 receives the enabling signal set, the first control signal Ctl1A, the inverted first control signal Ctl1B, the second control signal Ctl2A and the inverted second control signal Ctl2B.

In normal operation, one of the first level shifter 122 and the second level shifter 124 is enabled according to the enabling signal set. When the first level shifter 122 is enabled, the first level shifter 122 generates the output signal OUT and the inverted output signal ZOUT according to the first control signal Ctl1A and the inverted first control signal Ctl1B. When the second level shifter 124 is enabled, the second level shifter 124 generates the output signal OUT and the inverted output signal ZOUT according to the second control signal Ctl2A and the inverted second control signal Ctl2B.

When the driving circuit 100 is in a first operation mode, the first control circuit 102 is activated and the second control circuit 104 is inactivated. Meanwhile, the first control circuit 102 converts the first input signal IN1 and the inverted first input signal ZIN1 into the first control signal Ctl1A and the inverted first control signal Ctl1B, but the second control circuit 104 does not convert the second input signal IN2 and the inverted second input signal ZIN2 into the second control signal Ctl2A and the inverted second control signal Ctl2B. In response to the first input signal IN1 and the inverted first input signal ZIN1, the enabling circuit 106 generates the enabling signal set to the driving stage 120. Consequently, the first level shifter 122 is enabled to generate the output signal OUT and the inverted output signal ZOUT, and the second level shifter 124 is disabled.

When the driving circuit 100 is in a second operation mode, the second control circuit 104 is activated and the first control circuit 102 is inactivated. Meanwhile, the second control circuit 104 converts the second input signal IN2 and the inverted second input signal ZIN2 into the second control signal Ctl2A and the inverted second control signal Ctl2B, but the first control circuit 102 does not convert the first input signal IN1 and the inverted first input signal ZIN1 into the first control signal Ctl1A and the inverted first control signal Ctl1B. In response to the second input signal IN2 and the inverted second input signal ZIN2, the enabling circuit 106 generates the enabling signal set to the driving stage 120. Consequently, the second level shifter 124 is enabled to generate the output signal OUT and the inverted output signal ZOUT, and the first level shifter 122 is disabled.

Figure 2A:
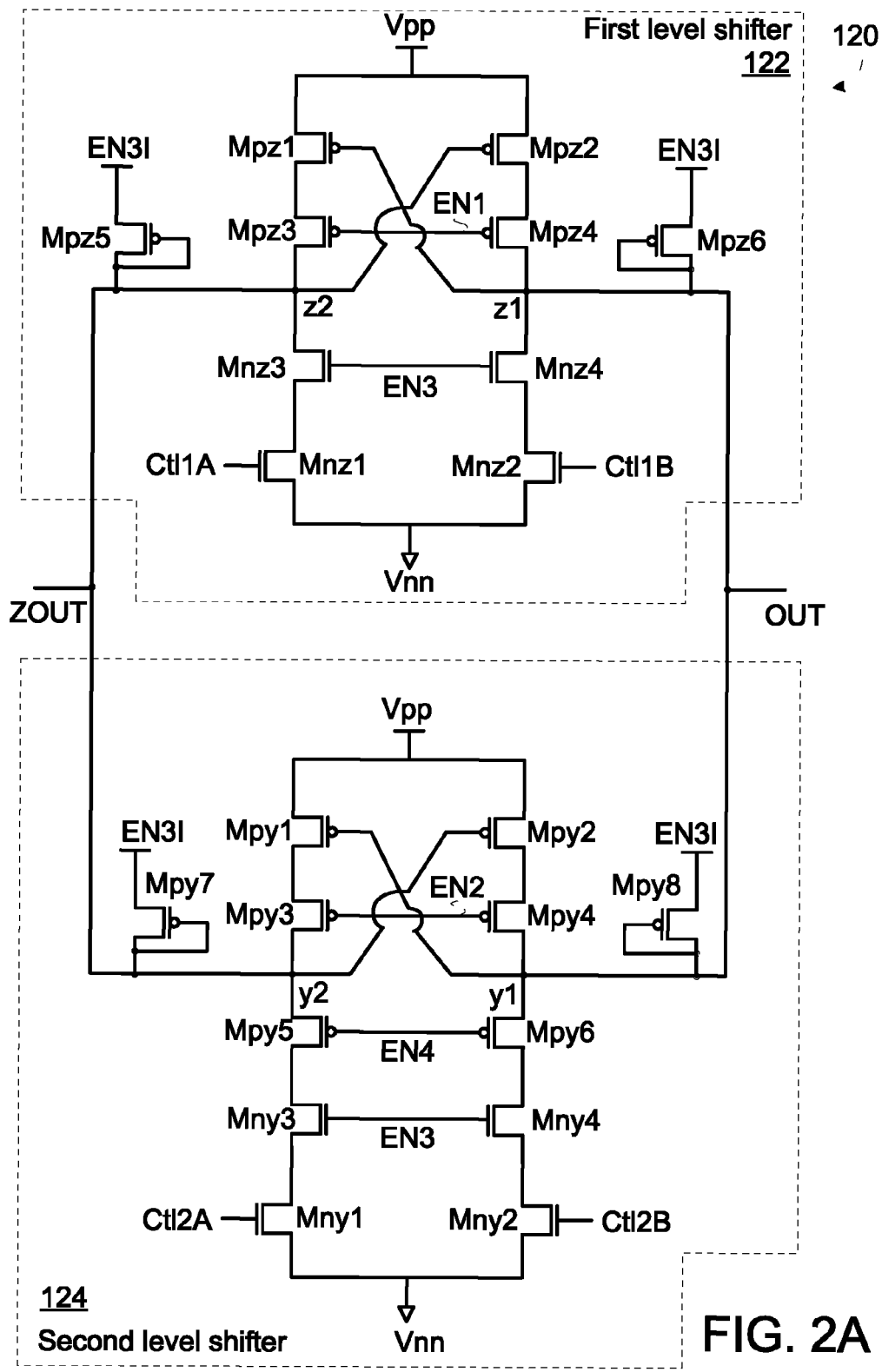
FIG. 2A is a schematic circuit diagram illustrating a first exemplary driving stage of the driving circuit according to the embodiment of the present invention.

FIG. 2A is a schematic circuit diagram illustrating a first exemplary driving stage of the driving circuit according to the embodiment of the present invention.

The first level shifter 122 comprises plural p-type transistors Mpz1, Mpz2, Mpz3, Mpz4, Mpz5 and Mpz6 and plural n-type transistors Mnz1, Mnz2, Mnz3 and Mnz4. The source terminal of the transistor Mpz1 is connected with the second supply voltage Vpp. The gate terminal of the transistor Mpz1 is connected with a node z1. The source terminal of the transistor Mpz3 is connected with the drain terminal of the transistor Mpz1. The gate terminal of the transistor Mpz3 receives the first enabling signal EN1. The drain terminal of the transistor Mpz3 is connected with a node z2. The source terminal of the transistor Mpz5 is connected with the inverted third enabling signal EN3I. The gate terminal and the drain terminal of the transistor Mpz5 are connected with the node z2. The drain terminal of the transistor Mnz3 is connected with the node z2. The gate terminal of the transistor Mnz3 receives the third enabling signal EN3. The drain terminal of the transistor Mnz1 is connected with the source terminal of the transistor Mnz3. The gate terminal of the transistor Mnz1 receives the first control signal Ctl1A. The source terminal of the transistor Mnz1 is connected with the third supply voltage Vnn.

The source terminal of the transistor Mpz2 is connected with the second supply voltage Vpp. The gate terminal of the transistor Mpz2 is connected with the node z2. The source terminal of the transistor Mpz4 is connected with the drain terminal of the transistor Mpz2. The gate terminal of the transistor Mpz4 receives the first enabling signal EN1. The drain terminal of the transistor Mpz4 is connected with the node z1. The source terminal of the transistor Mpz6 is connected with the inverted third enabling signal EN3I. The gate terminal and the drain terminal of the transistor Mpz6 are connected with the node z1. The drain terminal of the transistor Mnz4 is connected with the node z1. The gate terminal of the transistor Mnz4 receives the third enabling signal EN3. The drain terminal of the transistor Mnz2 is connected with the source terminal of the transistor Mnz4. The gate terminal of the transistor Mnz2 receives the inverted first control signal Ctl1B. The source terminal of the transistor Mnz2 is connected with the third supply voltage Vnn.

The second level shifter 124 comprises plural p-type transistors Mpy1, Mpy2, Mpy3, Mpy4, Mpy5, Mpy6, Mpy7 and Mpy8 and plural n-type transistors Mny1, Mny2, Mny3 and Mny4. The source terminal of the transistor Mpy1 is connected with the second supply voltage Vpp. The gate terminal of the transistor Mpy1 is connected with a node y1.

The source terminal of the transistor Mpy3 is connected with the drain terminal of the transistor Mpy1. The gate terminal of the transistor Mpy3 receives the second enabling signal EN2. The drain terminal of the transistor Mpy3 is connected with a node y2. The source terminal of the transistor Mpy7 receives the inverted third enabling signal EN3I. The gate terminal and the drain terminal of the transistor Mpy7 are connected with a node y2. The source terminal of the transistor Mpy5 is connected with the node y2. The gate terminal of the transistor Mpy5 receives the fourth enabling signal EN4. The drain terminal of the transistor Mny3 is connected with the drain terminal of the transistor Mpy5. The gate terminal of the transistor Mny3 receives the third enabling signal EN3. The drain terminal of the transistor Mny1 is connected with the source terminal of the transistor Mny3. The gate terminal of the transistor Mny1 receives the second control signal Ctl2A. The source terminal of the transistor Mny1 is connected with the third supply voltage Vnn.

The source terminal of the transistor Mpy2 is connected with the second supply voltage Vpp. The gate terminal of the transistor Mpy2 is connected with the node y2. The source terminal of the transistor Mpy4 is connected with the drain terminal of the transistor Mpy2. The gate terminal of the transistor Mpy4 receives the second enabling signal EN2. The drain terminal of the transistor Mpy4 is connected with the node y1. The source terminal of the transistor Mpy8 receives the inverted third enabling signal EN3I. The gate terminal and the drain terminal of the transistor Mpy8 are connected with a node y1. The source terminal of the transistor Mpy6 is connected with the node y1. The gate terminal of the transistor Mpy6 receives the fourth enabling signal EN4. The drain terminal of the transistor Mny4 is connected with the drain terminal of the transistor Mpy6. The gate terminal of the transistor Mny4 receives the third enabling signal EN3. The drain terminal of the transistor Mny2 is connected with the source terminal of the transistor Mny4. The gate terminal of the transistor Mny2 receives the inverted second control signal Ctl2B. The source terminal of the transistor Mny2 is connected with the third supply voltage Vnn.

The node z1 and the node y1 are directly connected with each other and served as the output terminal of the driving stage 120 for generating the output signal OUT. The node z2 and the node y2 are directly connected with each other and served as the inverted output terminal of the driving stage 120 for generating the inverted output signal ZOUT.

The driving circuit 100 can control the non-volatile memory array 130. For achieving the purpose of ultra-low power consumption, the size ratio between the p-type transistor and the n-type transistor for the two level shifters should be specially designed. When the driving circuit 100 is in the first operation mode, the output signal OUT and the inverted output signal ZOUT from the first level shifter 122 are in a lower voltage range. When the driving circuit 100 is in the second operation mode, the output signal OUT and the inverted output signal ZOUT from the second level shifter 124 are in a higher voltage range. Consequently, a first size ratio between the p-type transistor and the n-type transistor of the first level shifter 122 is larger than a second size ratio between the p-type transistor and the n-type transistor of the second level shifter 124.

Moreover, when the driving circuit 100 is operated in different operation modes, the first supply voltage Vdd, the second supply voltage Vpp, the third supply voltage Vnn and the fourth supply voltage Vm provided by the voltage supplying circuit have different magnitudes.

FIG. 2B is a table illustrating the magnitudes of the supply voltages and the voltage levels of associated signals when the driving circuit with the driving stage of FIG. 2A is operated in different operation modes.

In the first operation mode, the first supply voltage Vdd from the voltage supplying circuit is lower than (Vthn+|Vthp|), for example 0.8V, wherein Vthn is a threshold voltage of the n-type transistor, and Vthp is a threshold voltage of the p-type transistor. The second supply voltage Vpp from the voltage supplying circuit is equal to the first supply voltage Vdd, i.e. Vpp=Vdd. The third supply voltage Vnn from the voltage supplying circuit is equal to 0V.

Moreover, the first enabling signal EN1, the inverted third enabling signal EN3I and the fourth enabling signal EN4 are in the low level state (0V), and the second enabling signal EN2 and the third enabling signal EN3 are in the high level state (Vdd). Consequently, the first level shifter 122 is enabled, and the second level shifter 124 is disabled.

In normal operation, when the first control signal Ctl1A is in the high level state (Vdd) and the inverted first control signal Ctl1B is in the low level state (0V), the transistors Mnz1, Mnz3, Mnz4, Mpz2, Mpz3 and Mpz4 are turned on and the transistors Mpz1, Mpz5, Mpz6 and Mnz2 are turned off. Consequently, the voltage at the node z1 is equal to the second supply voltage Vpp (Vpp=Vdd), the output signal OUT is equal to Vdd, the voltage at the node z2 is equal to the third supply voltage Vnn (Vnn=0V), and the inverted output signal ZOUT is 0V.

When the first control signal Ctl1A is in the low level state (0V) and the inverted first control signal Ctl1B is in the high level state (Vdd), the transistors Mnz2, Mnz3, Mnz4, Mpz1, Mpz3 and Mpz4 are turned on and the transistors Mpz2, Mpz5, Mpz6 and Mnz1 are turned off. Consequently, the voltage at the node z1 is equal to the third supply voltage Vnn (Vnn=0V), the output signal OUT is 0V, the voltage at the node z2 is equal to the second supply voltage Vpp (Vpp=Vdd), and the inverted output signal ZOUT is equal to Vdd. Since the first supply voltage Vdd is 0.8V, the voltage levels of the output signal OUT and the inverted output signal ZOUT are in the range between 0V and 0.8V.

There are three phases for the driving circuit 100 in the second operation mode. In the first phase (I) of the second operation mode, the first supply voltage Vdd from the voltage supplying circuit is higher than or equal to (Vthn+|Vthp|). For example, the first supply voltage Vdd is 1V. The second supply voltage Vpp from the voltage supplying circuit is equal to the first supply voltage Vdd, i.e. Vpp=Vdd. The third supply voltage Vnn is equal to 0V. Moreover, the first enabling signal EN1, the second enabling signal EN2, the third enabling signal EN3 and the fourth enabling signal EN4 are in the low level state (0V), and the inverted third enabling signal EN3I is in the high level state (Vdd). Consequently, the first level shifter 122 and the second level shifter 124 are disabled.

In the first phase (I) of the second operation mode, because of the diode connected transistors Mpx7, Mpx8, Mpy7 and Mpy8, the output signal OUT and the inverted output signal ZOUT are precharged to around the high level state (Vdd). That is to say, the first phase (I) of the second operation mode is a precharge phase.

In the second phase (II) of the second operation mode, the first supply voltage Vdd from the voltage supplying circuit is higher than or equal to (Vthn+|Vthp|). For example, the first supply voltage Vdd is 1V. The second supply voltage Vpp from the voltage supplying circuit is equal to the first supply voltage Vdd, i.e. Vpp=Vdd. The third supply voltage Vnn is equal to 0V. Moreover, the first enabling signal EN1, the second enabling signal EN2, the inverted third enabling signal EN3I and the fourth enabling signal EN4 are in the low level state (0V), and the third enabling signal EN3 is in the high level state (Vdd). Consequently, the first level shifter 122 and the second level shifter 124 are enabled.

In the second phase (II) of the second operation mode, the first level shifter 122 and the second level shifter 124 initialize the bias voltage at the internal nodes of the two level shifters 122 and 124. That is to say, the second phase (II) of the second operation mode is an initialization phase.

In the third phase (III) of the second operation mode, the first supply voltage Vdd from the voltage supplying circuit is higher than or equal to (Vthn+|Vthp|). For example, the first supply voltage Vdd is 1V. The second supply voltage Vpp from the voltage supplying circuit is increased to V1, which is equal to N times of the first supply voltage Vdd, i.e. Vpp=V1=N×Vdd. The third supply voltage Vnn is equal to 0V. The fourth supply voltage Vm from the voltage supplying circuit is increased to V2, which is equal to M times of the first supply voltage Vdd, i.e. Vm=V2=M×Vdd. According to the present invention, N is larger than M. For example, N is 3 and M is 2, the second supply voltage Vpp is 3V (V1=3V), and the fourth supply voltage Vm is 2V (Vm=2V).

Moreover, the first enabling signal EN1 and the third enabling signal EN3 are in the high level state (V1), and the second enabling signal, the inverted third enabling signal EN3I and the fourth enabling signal EN4 are in the low level state (V2). Consequently, the first level shifter 122 is disabled and the second level shifter 124 is enabled.

The third phase (III) of the second operation mode is a normal operation phase. When the second control signal Ctl2A is in the high level state (Vdd) and the inverted second control signal Ctl2B is in the low level state (0V), the transistors Mny1, Mny3, Mny4, Mpy2, Mpy3, Mpy4, Mpy5, Mpy6 and Mpy7 are turned on and the transistors Mpy1, Mpy8 and Mny2 are turned off. Consequently, the voltage at the node y1 is equal to the second supply voltage Vpp (Vpp=V1), the output signal OUT is equal to V1, the voltage at the node y2 is equal to the fourth supply voltage Vm (Vm=V2), and the inverted output signal ZOUT is equal to V2.

When the second control signal Ctl2A is in the low level state (0V) and the inverted second control signal Ctl2B is in the high level state (Vdd), the transistors Mny2, Mny3, Mny4, Mpy1, Mpy3, Mpy4, Mpy5, Mpy6 and Mpy8 are turned on and the transistors Mpy2, Mpy7 and Mny1 are turned off. Consequently, the voltage at the node y1 is equal to the fourth supply voltage Vm (Vm=V2), the output signal OUT is equal to the V2, the voltage at the node y2 is equal to the second supply voltage Vpp (Vpp=V1), and the inverted output signal ZOUT is equal to V1. Since the second supply voltage Vpp is 3V and the fourth supply voltage Vm is 2V, the voltage levels of the output signal OUT and the inverted output signal ZOUT are in the range between 3V and 2V.

Figure 3A:
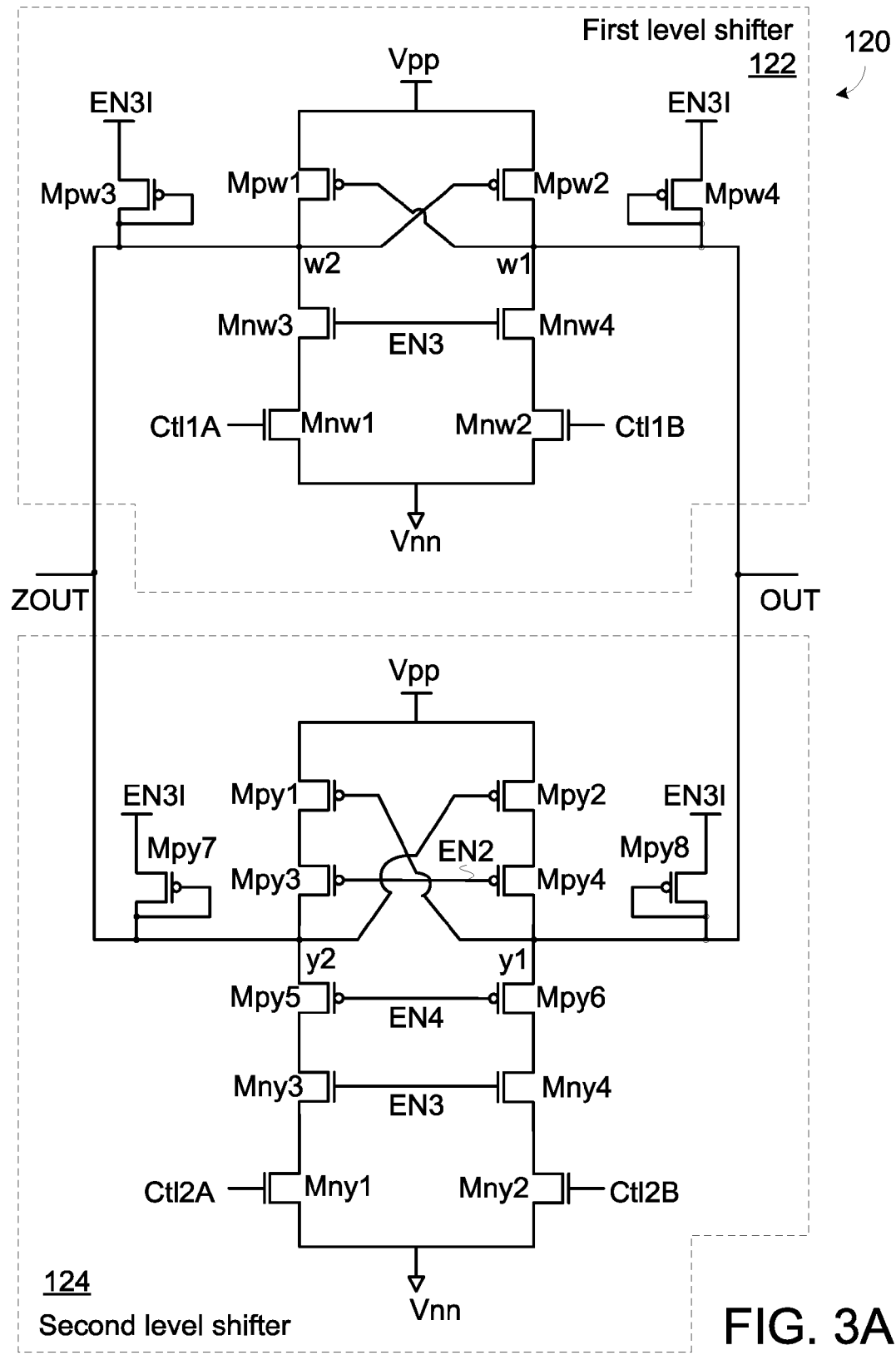
FIG. 3A is a schematic circuit diagram illustrating a second exemplary driving stage of the driving circuit according to the embodiment of the present invention.

FIG. 3A is a schematic circuit diagram illustrating a second exemplary driving stage of the driving circuit according to the embodiment of the present invention. The circuitry of the second level shifter 124 is identical to that of FIG. 2A, and is not redundantly described herein.

The first level shifter 122 comprises plural p-type transistors Mpw1, Mpw2, Mpw3 and Mpw4 and plural n-type transistors Mnw1, Mnw2, Mnw3 and Mnw4. The source terminal of the transistor Mpw1 is connected with the second supply voltage Vpp. The gate terminal of the transistor Mpw1 is connected with a node w1. The drain terminal of the transistor Mpw1 is connected with a node w2. The source terminal of the transistor Mpw3 is connected with the inverted third enabling signal EN3I. The gate terminal and the drain terminal of the transistor Mpw3 are connected with the node w2. The drain terminal of the transistor Mnw3 is connected with the node w2. The gate terminal of the transistor Mnw3 receives the third enabling signal EN3. The drain terminal of the transistor Mnw1 is connected with the source terminal of the transistor Mnw3. The gate terminal of the transistor Mnw1 receives the first control signal Ctl1A. The source terminal of the transistor Mnw1 is connected with the third supply voltage (Vnn).

The source terminal of the transistor Mpw2 is connected with the second supply voltage Vpp. The gate terminal of the transistor Mpw2 is connected with the node w2. The drain terminal of the transistor Mpw2 is connected with the node w1. The source terminal of the transistor Mpw4 is connected with the inverted third enabling signal EN3I. The gate terminal and the drain terminal of the transistor Mpw4 are connected with the node w1. The drain terminal of the transistor Mnw4 is connected with the node w1. The gate terminal of the transistor Mnw4 receives the third enabling signal EN3. The drain terminal of the transistor Mnw2 is connected with the source terminal of the transistor Mnw4. The gate terminal of the transistor Mnw2 receives the inverted first control signal Ctl1B. The source terminal of the transistor Mnw2 is connected with the third supply voltage Vnn.

The node w1 and the node y1 are directly connected with each other and served as the output terminal of the driving stage 120 for generating the output signal OUT. The first node w2 and the node y2 are directly connected with each other and served as the inverted output terminal of the driving stage 120 for generating the inverted output signal ZOUT.

For achieving the purpose of ultra-low power consumption, the size ratio between the p-type transistor and the n-type transistor for the two level shifters should be specially designed. That is, a first size ratio between the p-type transistor and the n-type transistor of the first level shifter 122 is larger than a second size ratio between the p-type transistor and the n-type transistor of the second level shifter 124.

Moreover, when the driving circuit 100 is operated in different operation modes, the first supply voltage Vdd, the second supply voltage Vpp, the third supply voltage Vnn and the fourth supply voltage Vm provided by the voltage supplying circuit have different magnitudes.

FIG. 3B is a table illustrating the magnitudes of the supply voltages and the voltage levels of associated signals when the driving circuit with the driving stage of FIG. 3A is operated in different operation modes.

In the first operation mode, the first supply voltage Vdd from the voltage supplying circuit is lower than (Vthn+|Vthp|), for example 0.8V, wherein Vthn is a threshold voltage of the n-type transistor, and Vthp is a threshold voltage of the p-type transistor. The second supply voltage Vpp from the voltage supplying circuit is equal to the first supply voltage Vdd, i.e. Vpp=Vdd. The third supply voltage Vnn from the voltage supplying circuit is equal to 0V.

Moreover, the first enabling signal EN1 is not cared, the inverted third enabling signal EN3I and the fourth enabling signal EN4 are in the low level state (0V), and the second enabling signal EN2 and the third enabling signal EN3 are in the high level state (Vdd). Consequently, the second level shifter 124 is disabled.

When the first control signal Ctl1A is in the high level state (Vdd) and the inverted first control signal Ctl1B is in the low level state (0V), the transistors Mnw1, Mnw3, Mnw4 and Mpw2 are turned on and the transistors Mpw1, Mpw3, Mpw4 and Mnw2 are turned off. Consequently, the voltage at the node w1 is equal to the second supply voltage Vpp (Vpp=Vdd), the output signal OUT is equal to Vdd, the voltage at the node w2 is equal to the third supply voltage Vnn (Vnn=0V), and the inverted output signal ZOUT is 0V.

When the first control signal Ctl1A is in the low level state (0V) and the inverted first control signal Ctl1B is in the high level state (Vdd), the transistors Mnw2, Mnw3, Mnw4 and Mpw1 are turned on and the transistors Mpw2, Mpw3, Mpw4 and Mnw1 are turned off. Consequently, the voltage at the node w1 is equal to the third supply voltage Vnn (Vnn=0V), the output signal OUT is 0V, the voltage at the node w2 is equal to the second supply voltage Vpp (Vpp=Vdd), and the inverted output signal ZOUT is equal to Vdd. Since the first supply voltage Vdd is 0.8V, the voltage levels of the output signal OUT and the inverted output signal ZOUT are in the range between 0V and 0.8V.

There are three phases for the driving circuit 100 in the second operation mode. In the first phase (I) of the second operation mode, the first supply voltage Vdd from the voltage supplying circuit is higher than or equal to (Vthn+ |Vthp|). For example, the first supply voltage Vdd is 1V. The second supply voltage Vpp from the voltage supplying circuit is equal to the first supply voltage Vdd, i.e. Vpp=Vdd. The third supply voltage Vnn is equal to 0V. Moreover, the second enabling signal EN2, the third enabling signal EN3 and the fourth enabling signal EN4 are in the low level state (0V), and the inverted third enabling signal EN3I is in the high level state (Vdd). Consequently, the second level shifter 124 is disabled. Also, the first control signal Ctl1A and the inverted first control signal Ctl1B are in the low level state (0V).

In the first phase (I) of the second operation mode, because of the diode connected transistors Mpw3, Mpw4, Mpy7 and Mpy8, the output signal OUT and the inverted output signal ZOUT are precharged to the high level state (Vdd). That is to say, the first phase (I) of the second operation mode is a precharge phase.

In the second phase (II) of the second operation mode, the first supply voltage Vdd from the voltage supplying circuit is higher than or equal to (Vthn+|Vthp|). For example, the first supply voltage Vdd is 1V. The second supply voltage Vpp from the voltage supplying circuit is equal to the first supply voltage Vdd, i.e. Vpp=Vdd. The third supply voltage Vnn is equal to 0V. Moreover, the first enabling signal EN1 is not cared, the second enabling signal EN2, the inverted third enabling signal EN3I and the fourth enabling signal EN4 are in the low level state (0V), and the third enabling signal EN3 is in the high level state (Vdd). Consequently, the second level shifter 124 is enabled. Also, the first control signal Ctl1A and the inverted first control signal Ctl1B are in the low level state (0V).

In the second phase (II) of the second operation mode, the first level shifter 122 and the second level shifter 124 initialize the bias voltage at the internal nodes of the two level shifters 122 and 124. That is to say, the second phase (II) of the second operation mode is an initialization phase.

In the third phase (III) of the second operation mode, the first supply voltage Vdd from the voltage supplying circuit is higher than or equal to (Vthn+|Vthp|). For example, the first supply voltage Vdd is 1V. The second supply voltage Vpp from the voltage supplying circuit is increased to V1, which is equal to N times of the first supply voltage Vdd, i.e. Vpp=V1=N×Vdd. The third supply voltage Vnn is equal to 0V. The fourth supply voltage Vm from the voltage supplying circuit is increased to V2, which is equal to M times of the first supply voltage Vdd, i.e. Vm=V2=M×Vdd. According to the present invention, N is larger than M. For example, N is 3 and M is 2, the second supply voltage Vpp is 3V (V1=3V), and the fourth supply voltage Vm is 2V (V2=2V).

Moreover, the first enabling signal EN1 is not cared, the third enabling signal EN3 is in the high level state (V1), and the second enabling signal EN2 and the inverted third enabling signal EN3I and the fourth enabling signal EN4 are in the low level state (V2). Consequently, the second level shifter 124 is enabled. Also, the first control signal Ctl1A and the inverted first control signal Ctl1B are in the low level state (0V).

When the second control signal Ctl2A is in the high level state (Vdd) and the inverted second control signal Ctl2B is in the low level state (0V), the transistors Mny1, Mny3, Mny4, Mpy2, Mpy3, Mpy4, Mpy5, Mpy6 and Mpy7 are turned on and the transistors Mpy1, Myp8 and Mny2 are turned off. Consequently, the voltage at the node y1 is equal to the second supply voltage Vpp (Vpp=V1), the output signal OUT is equal to V1, the voltage at the node y2 is equal to the fourth supply voltage Vm (Vm=V2), and the inverted output signal ZOUT is equal to V2.

When the second control signal Ctl2A is in the low level state (0V) and the inverted second control signal Ctl2B is in the high level state (Vdd), the transistors Mny2, Mny3, Mny4, Mpy1, Mpy3, Mpy4, Mpy5, Mpy6 and Mpy8 are turned on and the transistors Mpy2, Mpy7 and Mny1 are turned off. Consequently, the voltage at the node y1 is equal to the fourth supply voltage Vm (Vm=V2), the output signal OUT is equal to V2, the voltage at the node y2 is equal to the second supply voltage Vpp (Vpp=V1), and the inverted output signal ZOUT is equal to V1. Since the second supply voltage Vpp is 3V and the fourth supply voltage Vm is 2V, the voltage levels of the output signal OUT and the inverted output signal ZOUT are in the range between 2V and 3V.

Figure 4A:
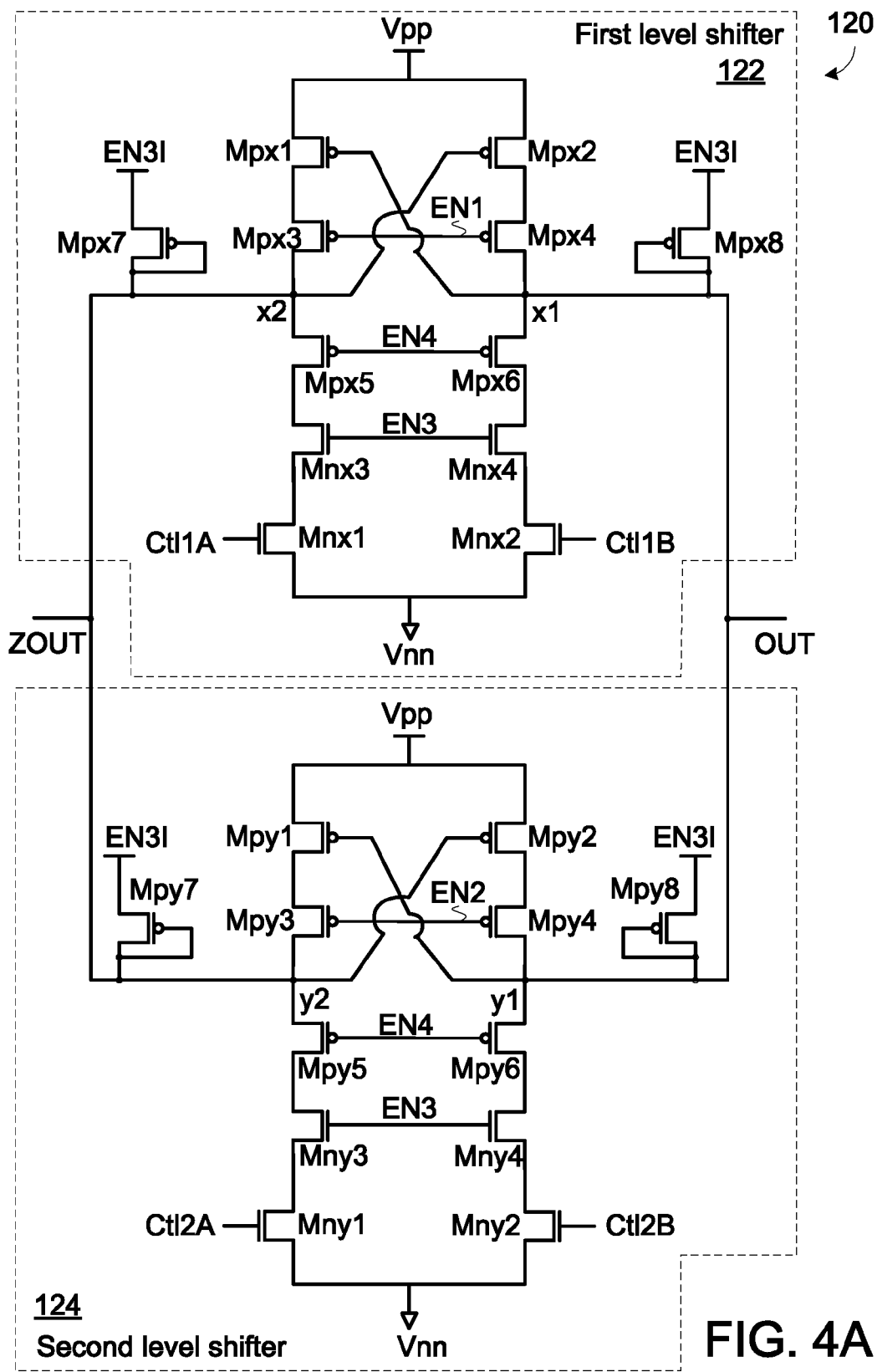
FIG. 4A is a schematic circuit diagram illustrating a third exemplary driving stage of the driving circuit according to the embodiment of the present invention.

FIG. 4A is a schematic circuit diagram illustrating a third exemplary driving stage of the driving circuit according to the embodiment of the present invention. The circuitry of the second level shifter 124 is identical to that of FIG. 2A, and is not redundantly described herein.

The first level shifter 122 comprises plural p-type transistors Mpx1, Mpx2, Mpx3, Mpx4, Mpx5, Mpx6, Mpx7 and Mpx8 and plural n-type transistors Mnx1, Mnx2, Mnx3 and Mnx4. The source terminal of the transistor Mpx1 is connected with the second supply voltage Vpp. The gate terminal of the transistor Mpx1 is connected with a node x1. The source terminal of the transistor Mpx3 is connected with the drain terminal of the transistor Mpx1. The gate terminal of the transistor Mpx3 receives the first enabling signal EN1. The drain terminal of the transistor Mpx3 is connected with a node x2. The source terminal of the transistor Mpx7 receives the inverted third enabling signal EN3I. The gate terminal and the drain terminal of the transistor Mpx7 are connected with a node x2. The source terminal of the transistor Mpx5 is connected with the node x2. The gate terminal of the transistor Mpx5 receives the fourth enabling signal EN4. The drain terminal of the transistor Mnx3 is connected with the drain terminal of the transistor Mpx5. The gate terminal of the transistor Mnx3 receives the third enabling signal EN3. The drain terminal of the transistor Mnx1 is connected with the source terminal of the transistor Mnx3. The gate terminal of the transistor Mnx1 receives the first control signal Ctl1A. The source terminal of the transistor Mnx1 is connected with the third supply voltage Vnn.

The source terminal of the transistor Mpx2 is connected with the second supply voltage Vpp. The gate terminal of the transistor Mpx2 is connected with the node x2. The source terminal of the transistor Mpx4 is connected with the drain terminal of the transistor Mpx2. The gate terminal of the transistor Mpx4 receives the first enabling signal EN1. The drain terminal of the transistor Mpx4 is connected with the node x1. The source terminal of the transistor Mpx8 receives the inverted third enabling signal EN3I. The gate terminal and the drain terminal of the transistor Mpx8 are connected with a node x1. The source terminal of the transistor Mpx6 is connected with the node x1. The gate terminal of the transistor Mpx6 receives the fourth enabling signal EN4. The drain terminal of the transistor Mnx4 is connected with the drain terminal of the transistor Mpx6. The gate terminal of the transistor Mnx4 receives the third enabling signal EN3. The drain terminal of the transistor Mnx2 is connected with the source terminal of the transistor Mnx4. The gate terminal of the transistor Mnx2 receives the inverted first control signal Ctl1B. The source terminal of the transistor Mnx2 is connected with the third supply voltage Vnn.

The node x1 and the node y1 are directly connected with each other and served as the output terminal of the driving stage 120 for generating the output signal OUT. The node x2 and the node y2 are directly connected with each other and served as the inverted output terminal of the driving stage 120 for generating the inverted output signal ZOUT.

For achieving the purpose of ultra-low power consumption, the size ratio between the p-type transistor and the n-type transistor for the two level shifters should be specially designed. That is, a first size ratio between the p-type transistor and the n-type transistor of the first level shifter 122 is larger than a second size ratio between the p-type transistor and the n-type transistor of the second level shifter 124.

Moreover, when the driving circuit 100 is operated in different operation modes, the first supply voltage Vdd, the second supply voltage Vpp and the third supply voltage Vnn provided by the voltage supplying circuit have different magnitudes.

FIG. 4B is a table illustrating the magnitudes of the supply voltages and the voltage levels of associated signals when the driving circuit with the driving stage of FIG. 4A is operated in different operation modes.

In the first operation mode, the first supply voltage Vdd from the voltage supplying circuit is lower than (Vthn+|Vthp|), for example 0.8V, wherein Vthn is a threshold voltage of the n-type transistor, and Vthp is a threshold voltage of the p-type transistor. The second supply voltage Vpp from the voltage supplying circuit is equal to the first supply voltage Vdd, i.e. Vpp=Vdd. The third supply voltage Vnn from the voltage supplying circuit is equal to 0V.

Moreover, the first enabling signal EN1, the inverted third enabling signal EN3I and the fourth enabling signal EN4 are in the low level state (0V), and the second enabling signal EN2 and the third enabling signal EN3 are in the high level state (Vdd). Consequently, the first level shifter 122 is enabled, and the second level shifter 124 is disabled.

In normal operation, when the first control signal Ctl1A is in the high level state (Vdd) and the inverted first control signal Ctl1B is in the low level state (0V), the transistors Mnx1, Mnx3, Mnx4, Mpx2, Mpx3, Mpx4, Mpx5 and Mpx6 are turned on and the transistors Mpx1, Mxp7, Mxp8 and Mnx2 are turned off. Consequently, the voltage at the node x1 is equal to the second supply voltage Vpp (Vpp=Vdd), the output signal OUT is equal to Vdd, the voltage at the node x2 is equal to the third supply voltage Vnn (Vnn=0V), and the inverted output signal ZOUT is equal to 0V.

When the first control signal Ctl1A is in the low level state (0V) and the inverted first control signal Ctl1B is in the high level state (Vdd), the transistors Mnx2, Mnx3, Mnx4, Mpx1, Mpx3, Mpx4, Mpx5 and Mpx6 are turned on and the transistors Mpx2, Mxp7, Mxp8 and Mnx1 are turned off. Consequently, the voltage at the node x1 is equal to the third supply voltage Vnn (Vnn=0V), the output signal OUT is 0V, the voltage at the node x2 is equal to the second supply voltage Vpp (Vpp=Vdd), and the inverted output signal ZOUT is equal to Vdd. Since the first supply voltage Vdd is, for example, 0.8V, the voltage levels of the output signal OUT and the inverted output signal ZOUT are in the range between 0V and 0.8V.

There are three phases in the second operation mode. The operation of the second level shifter 124 is the same with the first exemplary driving stage of the driving circuit, and is not redundantly described herein.

As mentioned above, the driving circuit 100 can provide different logic levels to control the non-volatile memory array 130 according to different operation modes. For example, the logic level in a narrower range is provided to perform a read operation when the driving circuit is in the first operation mode, and the logic level in a wider range is provided to perform a program operation when the driving circuit is in the second operation mode.

Moreover, the driving stage 120 of the driving circuit 100 comprises the first level shifter 122 and the second level shifter 124. Generally, the first level shifter 122 and the second level shifter 124 are cross couple latches. In other words, the first level shifter 122 and the second level shifter 124 of the driving stage 120 may be replaced by a first cross couple latch and a second cross couple latch, respectively.

Furthermore, because the first level shifter 122 of the driving stage 120 is operated in a narrower range in the first operation mode, some pull-down circuits may be added in the first level shifter 122 to accurately provide the ground voltage (0V) to the output signal OUT or the inverted output signal ZOUT to 0V.

Figure 5A:
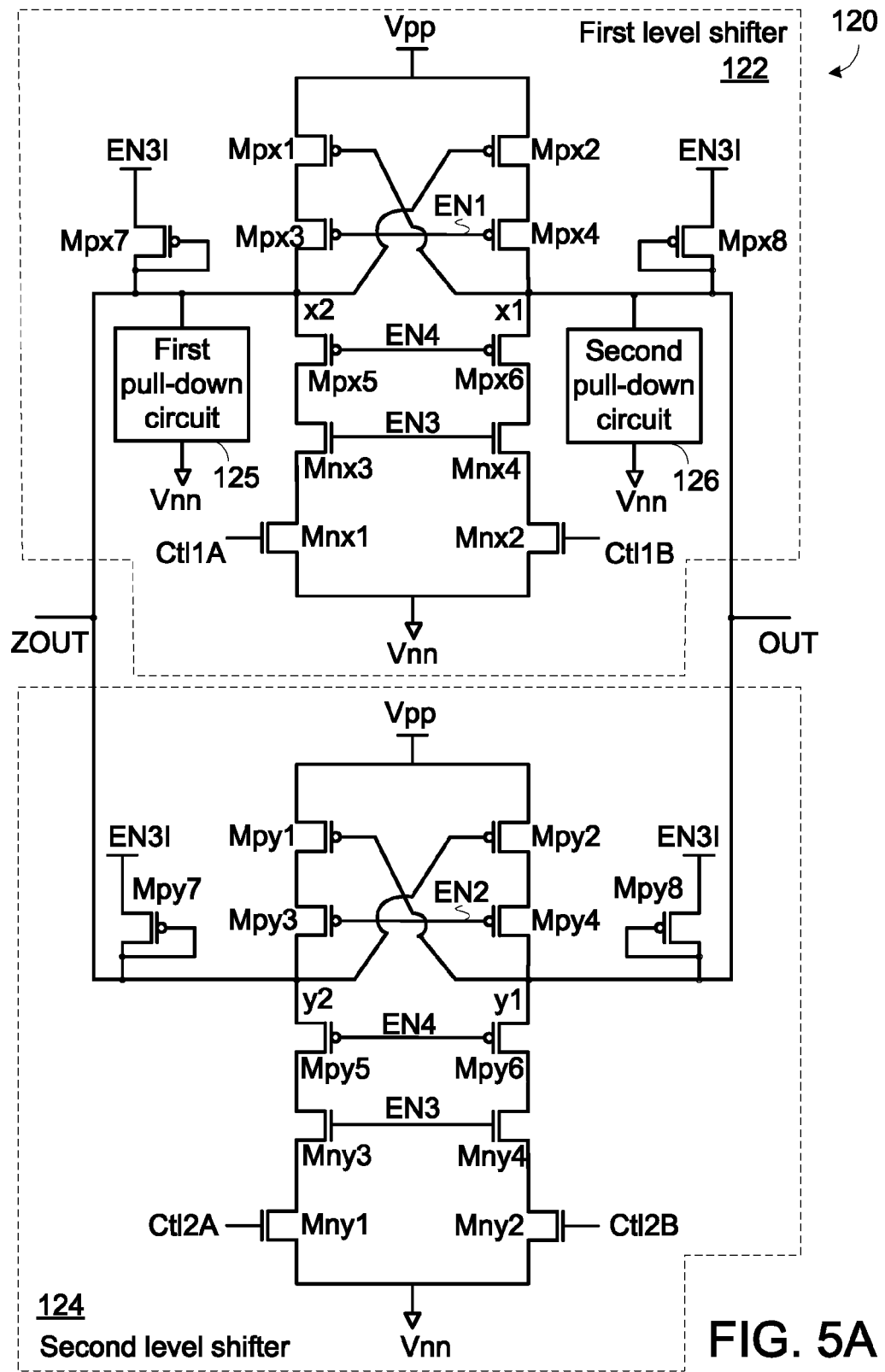
FIG. 5A is a schematic circuit diagram illustrating a fifth exemplary driving stage of the driving circuit according to the embodiment of the present invention.

FIG. 5A is a schematic circuit diagram illustrating a fifth exemplary driving stage of the driving circuit according to the embodiment of the present invention. In comparison with the fourth exemplary driving stage of the driving circuit shown in FIG. 4A, two pull-down circuits 125 and 126 are added in the first level shifter 122.

The first pull-down circuit 125 is connected between the node x2 and the third supply voltage Vnn, and the second pull-down circuit 126 is connected between the node x1 and the third supply voltage Vnn. In the first operation mode, the first pull-down circuit 125 is activated and the second pull-down circuit 126 is inactived when the output signal OUT is Vpp and the inverted output signal is 0V. In this way, the node x2 is pulled down to 0V and the transistor Mpx2 is fully turned on to provide Vpp to the node x1.

Also, the first pull-down circuit 125 is inactivated and the second pull-down circuit 126 is actived when the output signal OUT is 0V and the inverted output signal is Vpp. In this way, the node x1 is pulled down to 0V and the transistor Mpx1 is fully turned on to provide Vpp to the node x2.

Figure 5B:
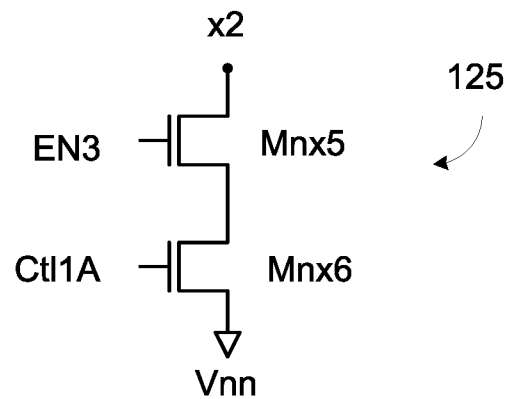
FIGS. 5B and 5C are schematic circuits diagram illustrating the first pull-down circuit and the second pull-down circuit.
Figure 5C:
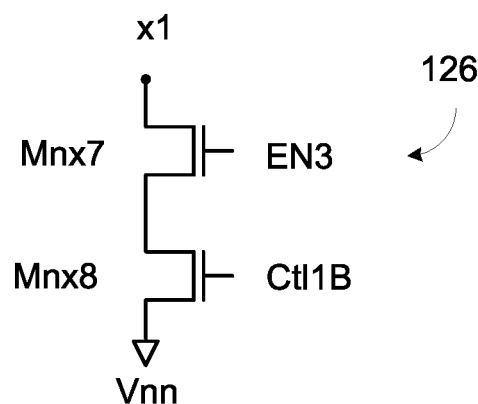

FIGS. 5B and 5C are schematic circuits diagram illustrating the first pull-down circuit and the second pull-down circuit. The first pull-down circuit 125 comprises n-type transistors Mnx5 and Mnx6. The drain terminal of the transistor Mnx5 is connected with the node x2. The gate terminal of the transistor Mnx5 receives the third enabling signal EN3. The drain terminal of the transistor Mnx6 is connected with the source terminal of the transistor Mnx5. The gate terminal of the transistor Mnx6 receives the first control signal Ctl1A. The source terminal of the transistor Mnx6 is connected with the third supply voltage Vnn.

The second pull-down circuit 126 comprises n-type transistors Mnx7 and Mnx8. The drain terminal of the transistor Mnx7 is connected with the node x1. The gate terminal of the transistor Mnx7 receives the third enabling signal EN3. The drain terminal of the transistor Mnx8 is connected with the source terminal of the transistor Mnx7. The gate terminal of the transistor Mnx8 receives the inverted first control signal Ctl1B. The source terminal of the transistor Mnx8 is connected with the third supply voltage Vnn.

The same, the first pull-down circuit 125 and the second pull-down circuit 126 shown in FIG. 5A can further applied to the first level shifter 122 shown in FIG. 2A or the first level shifter 122 shown in FIG. 3A, and are not redundantly described herein.

From the above descriptions, the present invention provides a driving circuit for a non-volatile memory. The driving circuit can provide different logic levels to control the memory array of the non-volatile memory according to different operation modes. Consequently, the operation of the non-volatile memory can achieve the purpose of ultra-low power consumption.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A driving circuit connected to a memory array of a non-volatile memory, the driving circuit comprising a driving stage, the driving stage comprising:
   a first level shifter comprising a first input terminal, a first inverted input terminal, a first output terminal and a second output terminal, wherein the first input terminal receives a first control signal, and the first inverted input terminal receives an inverted first control signal; and
   a second level shifter comprising a second input terminal, a second inverted input terminal, a third output terminal and a fourth output terminal, wherein the second input terminal receives a second control signal, the second inverted input terminal receives an inverted second control signal, the first output terminal and the third output terminal are directly connected with each other to generate an output signal, and the second output terminal and the fourth output terminal are directly connected with each other to generate an inverted output signal,
   wherein the first level shifter is enabled according to an enabling signal set when the driving circuit is in a first operation mode, and the second level shifter is enabled according to the enabling signal set when the driving circuit is in a second operation mode.

2. The driving circuit as claimed in claim 1, wherein the first level shifter is a first cross couple latch, and the second level shifter is a second cross couple latch.

3. The driving circuit as claimed in claim 1, wherein the driving circuit further comprises a control stage, and the control stage comprises:
   a first control circuit receiving a first input signal and an inverted first input signal, and converting the first input signal and the inverted first input signal into the first control signal and the inverted first control signal;
   a second control circuit receiving a second input signal and an inverted second input signal, and converting the second input signal and the inverted second input signal into the second control signal and the inverted second control signal; and
   an enabling circuit receiving the first input signal, the inverted first input signal, the second input signal and the inverted second input signal, and generating the enabling signal set, wherein the first level shifter or the second level shifter is disabled according to the enabling signal set.

4. The driving circuit as claimed in claim 3, wherein the first control circuit and the second control circuit receive a first supply voltage, so that the first control signal, the inverted first control signal, the second control signal and the inverted second control signal have voltage levels in a range between the first supply voltage and a ground voltage.

5. The driving circuit as claimed in claim 1, wherein the enabling signal set contains a first enabling signal, a second enabling signal, a third enabling signal, an inverted third enabling signal and a fourth enabling signal, wherein the second level shifter comprises:
   a first p-type transistor, wherein a source terminal of the first p-type transistor is connected with a second supply voltage, and a gate terminal of the first p-type transistor is connected with a node y1;
   a second p-type transistor, wherein a source terminal of the second p-type transistor is connected with the second supply voltage, and a gate terminal of the second p-type transistor is connected with a node y2;
   a third p-type transistor, wherein a source terminal of the third p-type transistor is connected with a drain terminal of the first p-type transistor, a gate terminal of the third p-type transistor receives the second enabling signal, and a drain terminal of the third p-type transistor is connected with the node y2;
   a fourth p-type transistor, wherein a drain terminal of the fourth p-type transistor is connected with a drain terminal of the second p-type transistor, a gate terminal of the fourth p-type transistor receives the second enabling signal, and a drain terminal of the fourth p-type transistor is connected with the node y1;
   a fifth p-type transistor, wherein a source terminal of the fifth p-type transistor is connected with the node y2, a gate terminal of the fifth p-type transistor receives the fourth enabling signal;
   a sixth p-type transistor, wherein a source terminal of the sixth p-type transistor is connected with the node y1, and a gate terminal of the sixth p-type transistor receives the fourth enabling signal;
   a seventh p-type transistor, wherein a source terminal of the seventh p-type transistor receives the inverted third enabling signal, and a gate terminal and a drain terminal of the seventh p-type transistor are connected with the node y2;
   an eighth p-type transistor, wherein a source terminal of the eighth p-type transistor receives the inverted third enabling signal, and a gate terminal and a drain terminal of the eighth p-type transistor are connected with the node y1;
   a first n-type transistor, wherein a source terminal of the first n-type transistor is connected with a third supply voltage, and a gate terminal of the first n-type transistor receives the second control signal;

a second n-type transistor, wherein a source terminal of the second n-type transistor is connected with the third supply voltage, and a gate terminal of the second n-type transistor receives the inverted second control signal;

a third n-type transistor, wherein a source terminal of the third n-type transistor is connected with a drain terminal of the first n-type transistor, a gate terminal of the third n-type transistor receives the third enabling signal, and a drain terminal of the third n-type transistor is connected with a drain terminal of the fifth p-type transistor; and a fourth n-type transistor, wherein a source terminal of the fourth n-type transistor is connected with a drain terminal of the second n-type transistor, a gate terminal of the fourth n-type transistor receives the third enabling signal, and a drain terminal of the fourth n-type transistor is connected with a drain terminal of the sixth p-type transistor.

6. The driving circuit as claimed in claim 5, wherein the first level shifter comprises:

a ninth p-type transistor, wherein a source terminal of the ninth p-type transistor is connected with the second supply voltage, and a gate terminal of the ninth p-type transistor is connected with a node x1;

a tenth p-type transistor, wherein a source terminal of the tenth p-type transistor is connected with the second supply voltage, and a gate terminal of the tenth p-type transistor is connected with a node x2;

an eleventh p-type transistor, wherein a source terminal of the eleventh p-type transistor is connected with a drain terminal of the ninth p-type transistor, a gate terminal of the eleventh p-type transistor receives the first enabling signal, and a drain terminal of the eleventh p-type transistor is connected with the node x2;

a twelfth p-type transistor, wherein a source terminal of the twelfth p-type transistor is connected with a drain terminal of the tenth p-type transistor, a gate terminal of the twelfth p-type transistor receives the first enabling signal, and a drain terminal of the twelfth p-type transistor is connected with the node x1;

a thirteenth p-type transistor, wherein a source terminal of the thirteenth p-type transistor is connected with the node x2, a gate terminal of the thirteenth p-type transistor receives the fourth enabling signal;

a fourteenth p-type transistor, wherein a source terminal of the fourteenth p-type transistor is connected with the node x1, and a gate terminal of the fourteenth p-type transistor receives the fourth enabling signal;

a fifteenth p-type transistor, wherein a source terminal of the fifteenth p-type transistor receives the inverted third enabling signal, and a gate terminal and a drain terminal of the fifteenth p-type transistor are connected with the node x2;

a sixteenth p-type transistor, wherein a source terminal of the sixteenth p-type transistor receives the inverted third enabling signal, and a gate terminal and a drain terminal of the sixteenth p-type transistor are connected with the node x1;

a fifth n-type transistor, wherein a source terminal of the fifth n-type transistor is connected with the third supply voltage, and a gate terminal of the fifth n-type transistor receives the first control signal;

a sixth n-type transistor, wherein a source terminal of the sixth n-type transistor is connected with the third supply voltage, and a gate terminal of the sixth n-type transistor receives the inverted first control signal;

a seventh n-type transistor, wherein a source terminal of the seventh n-type transistor is connected with a drain terminal of the fifth n-type transistor, a gate terminal of the seventh n-type transistor receives the third enabling signal, and a drain terminal of the seventh n-type transistor is connected with a drain terminal of the thirteenth p-type transistor; and an eighth n-type transistor, wherein a source terminal of the eighth n-type transistor is connected with a drain terminal of the sixth n-type transistor, a gate terminal of the eighth n-type transistor receives the third enabling signal, and a drain terminal of the eighth n-type transistor is connected with a drain terminal of the fourteenth p-type transistor, wherein the node x1 and the node y1 are directly connected with each other to generate the output signal, and the node x2 and the node y2 are directly connected with each other to generate the inverted output signal.

7. The driving circuit as claimed in claim 6, wherein a first size ratio between the p-type transistor and the n-type transistor of the first level shifter is larger than a second size ratio between the p-type transistor and the n-type transistor of the second level shifter.

8. The driving circuit as claimed in claim 6, wherein when the driving circuit is in the first operation mode, the first supply voltage has a first voltage value, the second supply voltage is equal to the first voltage value, and the third supply voltage is equal to the ground voltage, wherein when the driving circuit is in the second operation mode, the first supply voltage has a second voltage value, the second supply voltage is equal to N times of the second voltage value, and the third supply voltage is equal the ground voltage.

9. The driving circuit as claimed in claim 6, wherein first level shifter further comprises:

a first pull-down circuit connected between the node x2 and the third supply voltage; and a second pull-down circuit connected between the node x1 and the third supply voltage;

wherein the first pull-down circuit is activated and the second pull-down circuit is inactived when the output signal is equal to the second supply voltage and the inverted output signal is equal to the third supply voltage, and the first pull-down circuit is inactivated and the second pull-down circuit is actived when the output signal is the third supply voltage and the inverted output signal is the second supply voltage.

10. The driving circuit as claimed in claim 9, wherein first pull-down circuit comprises: a ninth n-type transistor having a drain terminal connected with the node x2 and a gate terminal connected with the third enabling signal; and a tenth n-type transistor having a drain terminal connected with a source terminal of the ninth n-type transistor, a gate terminal connected with the first control signal and a source terminal connected with the third supply voltage; and wherein second pull-down circuit comprises: a eleventh n-type transistor having a drain terminal connected with the node x1 and a gate terminal connected with the third enabling signal; and a twelfth n-type transistor having a drain terminal connected with a source terminal of the eleventh n-type transistor, a gate terminal connected with the inverted first control signal and a source terminal connected with the third supply voltage.

11. The driving circuit as claimed in claim 5, wherein the first level shifter comprises:

a ninth p-type transistor, wherein a source terminal of the ninth p-type transistor is connected with the second supply voltage, and a gate terminal of the ninth p-type transistor is connected with a node z1;

a tenth p-type transistor, wherein a source terminal of the tenth p-type transistor is connected with the second supply voltage, and a gate terminal of the tenth p-type transistor is connected with a node z2;

an eleventh p-type transistor, wherein a source terminal of the eleventh p-type transistor is connected with a drain terminal of the ninth p-type transistor, a gate terminal of the eleventh p-type transistor receives the first enabling signal, and a drain terminal of the eleventh p-type transistor is connected with the node z2;

a twelfth p-type transistor, wherein a source terminal of the twelfth p-type transistor is connected with a drain terminal of the tenth p-type transistor, a gate terminal of the twelfth p-type transistor receives the first enabling signal, and a drain terminal of the twelfth p-type transistor is connected with the node z1;

a thirteen p-type transistor, wherein a source terminal of the thirteenth p-type transistor receives the inverted third enabling signal, and a gate terminal and a drain terminal of the thirteenth p-type transistor are connected with the node z2;

a fourteenth p-type transistor, wherein a source terminal of the fourteenth p-type transistor receives the inverted third enabling signal, and a gate terminal and a drain terminal of the fourteenth p-type transistor are connected with the node z1;

a fifth n-type transistor, wherein a source terminal of the fifth n-type transistor is connected with the third supply voltage, and a gate terminal of the fifth n-type transistor receives the first control signal;

a sixth n-type transistor, wherein a source terminal of the sixth n-type transistor is connected with the third supply voltage, and a gate terminal of the sixth n-type transistor receives the inverted first control signal;

a seventh n-type transistor, wherein a source terminal of the seventh n-type transistor is connected with a drain terminal of the fifth n-type transistor, a gate terminal of the seventh n-type transistor receives the third enabling signal, and a drain terminal of the seventh n-type transistor is connected with the node z2; and an eighth n-type transistor, wherein a source terminal of the eighth n-type transistor is connected with a drain terminal of the sixth n-type transistor, a gate terminal of the eighth n-type transistor receives the third enabling signal, and a drain terminal of the eighth n-type transistor is connected with the node z1, wherein the node z1 and the node y1 are directly connected with each other to generate the output signal, and the node z2 and the node y2 are directly connected with each other to generate the inverted output signal.

12. The driving circuit as claimed in claim 11, wherein a first size ratio between the p-type transistor and the n-type transistor of the first level shifter is larger than a second size ratio between the p-type transistor and the n-type transistor of the second level shifter.

13. The driving circuit as claimed in claim 11, wherein when the driving circuit is in the first operation mode, the first supply voltage has a first voltage value, the second supply voltage is equal to the first voltage value, and the third supply voltage is equal to the ground voltage, wherein when the driving circuit is in the second operation mode, the first supply voltage has a second voltage value, the second supply voltage is equal to N times of the second voltage value, and the third supply voltage is equal to the ground voltage.

14. The driving circuit as claimed in claim 11, wherein first level shifter further comprises:

a first pull-down circuit connected between the node z2 and the third supply voltage; and a second pull-down circuit connected between the node z1 and the third supply voltage;

wherein the first pull-down circuit is activated and the second pull-down circuit is inactived when the output signal is equal to the second supply voltage and the inverted output signal is equal to the third supply voltage, and the first pull-down circuit is inactivated and the second pull-down circuit is actived when the output signal is the third supply voltage and the inverted output signal is the second supply voltage.

15. The driving circuit as claimed in claim 14, wherein first pull-down circuit comprises: a ninth n-type transistor having a drain terminal connected with the node z2 and a gate terminal connected with the third enabling signal; and a tenth n-type transistor having a drain terminal connected with a source terminal of the ninth n-type transistor, a gate terminal connected with the first control signal and a source terminal connected with the third supply voltage; and wherein second pull-down circuit comprises: a eleventh n-type transistor having a drain terminal connected with the node z1 and a gate terminal connected with the third enabling signal; and a twelfth n-type transistor having a drain terminal connected with a source terminal of the eleventh n-type transistor, a gate terminal connected with the inverted first control signal and a source terminal connected with the third supply voltage.

16. The driving circuit as claimed in claim 5, wherein the first level shifter comprises:

a ninth p-type transistor, wherein a source terminal of the ninth p-type transistor is connected with the second supply voltage, and a gate terminal of the ninth p-type transistor is connected with a node w1;

a tenth p-type transistor, wherein a source terminal of the tenth p-type transistor is connected with the second supply voltage, and a gate terminal of the tenth p-type transistor is connected with a node w2;

an eleventh p-type transistor, wherein a source terminal of the eleventh receives the inverted third enabling signal, and a gate terminal and a drain terminal of the eleventh p-type transistor are connected with a node w2;

a twelfth p-type transistor, wherein a source terminal of the twelfth receives the inverted third enabling signal, and a gate terminal and a drain terminal of the twelfth p-type transistor are connected with a node w1;

a fifth n-type transistor, wherein a source terminal of the fifth n-type transistor is connected with a third supply voltage, and a gate terminal of the fifth n-type transistor receives the first control signal;

a sixth n-type transistor, wherein a source terminal of the sixth n-type transistor is connected with the third supply voltage, and a gate terminal of the sixth n-type transistor receives the inverted first control signal;

a seventh n-type transistor, wherein a source terminal of the seventh n-type transistor is connected with a drain terminal of the fifth n-type transistor, a gate terminal of the seventh n-type transistor receives the third enabling signal, and a drain terminal of the seventh n-type transistor is connected with the node w2; and an eighth n-type transistor, wherein a source terminal of the eighth n-type transistor is connected with a drain terminal of the sixth n-type transistor, a gate terminal of the eighth n-type transistor receives the third enabling signal, and a drain terminal of the eighth n-type transistor is connected with the node w1, wherein the node w1 and the node y1 are directly connected with each other to generate the output signal, and the node w2 and the node y2 are directly connected with each other to generate the inverted output signal.

17. The driving circuit as claimed in claim 16, wherein a first size ratio between the p-type transistor and the n-type transistor of the first level shifter is larger than a second size ratio between the p-type transistor and the n-type transistor of the second level shifter.

18. The driving circuit as claimed in claim 16, wherein when the driving circuit is in the first operation mode, the first supply voltage has a first voltage value, the second supply voltage is equal to the first voltage value, and the third supply voltage is equal to the ground voltage, wherein when the driving circuit is in the second operation mode, the first supply voltage has a second voltage value, the second supply voltage is equal to N times of the second voltage value, the third supply voltage is equal to the ground voltage, and the fourth supply voltage is equal to M times of the second voltage value, wherein N is larger than M.

19. The driving circuit as claimed in claim 16, wherein first level shifter further comprises:

a first pull-down circuit connected between the node w2 and the third supply voltage; and a second pull-down circuit connected between the node w1 and the third supply voltage;

wherein the first pull-down circuit is activated and the second pull-down circuit is inactivated when the output signal is equal to the second supply voltage and the inverted output signal is equal to the third supply voltage, and the first pull-down circuit is inactivated and the second pull-down circuit is actived when the output signal is the third supply voltage and the inverted output signal is the second supply voltage.

20. The driving circuit as claimed in claim 19, wherein first pull-down circuit comprises: a ninth n-type transistor having a drain terminal connected with the node w2 and a gate terminal connected with the third enabling signal; and a tenth n-type transistor having a drain terminal connected with a source terminal of the ninth n-type transistor, a gate terminal connected with the first control signal and a source terminal connected with the third supply voltage; and wherein second pull-down circuit comprises: a eleventh n-type transistor having a drain terminal connected with the node w1 and a gate terminal connected with the third enabling signal; and a twelfth n-type transistor having a drain terminal connected with a source terminal of the eleventh n-type transistor, a gate terminal connected with the inverted first control signal and a source terminal connected with the third supply voltage.

* * * * *